(12) United States Patent
Wakabayashi

(10) Patent No.: US 11,688,619 B2
(45) Date of Patent: Jun. 27, 2023

(54) VACUUM PROCESSING APPARATUS AND SUBSTRATE TRANSFER METHOD

(71) Applicant: TOKYO ELECTRON LIMITED, Tokyo (JP)

(72) Inventor: Shinji Wakabayashi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 170 days.

(21) Appl. No.: 17/276,391

(22) PCT Filed: Sep. 10, 2019

(86) PCT No.: PCT/JP2019/035548
§ 371 (c)(1),
(2) Date: Mar. 15, 2021

(87) PCT Pub. No.: WO2020/059574
PCT Pub. Date: Mar. 26, 2020

(65) Prior Publication Data
US 2022/0044952 A1     Feb. 10, 2022

(30) Foreign Application Priority Data

Sep. 21, 2018 (JP) .............................. JP2018-177838

(51) Int. Cl.
*H01L 21/677* (2006.01)
*H01L 21/67* (2006.01)
(Continued)

(52) U.S. Cl.
CPC .. *H01L 21/67742* (2013.01); *H01L 21/67173* (2013.01); *H01L 21/67196* (2013.01);
(Continued)

(58) Field of Classification Search
CPC ......... H01L 21/67742; H01L 21/67173; H01L 21/67196; H01L 21/67201; H01L 21/67766; H01L 21/67775; H01L 21/6875
See application file for complete search history.

(56) References Cited

U.S. PATENT DOCUMENTS 7,949,425 B2 * 5/2011 Mitchell ........... H01L 21/67745
700/218
2007/0227033 A1 * 10/2007 Kobayashi .......... H01L 21/6831
34/406
(Continued)

FOREIGN PATENT DOCUMENTS

JP     2013-171872 A     9/2013

OTHER PUBLICATIONS

PCT International Search Report and Written Opinion, PCT Application No. PCT/JP2019/035548, dated Oct. 21, 2019, 8 pages (with English translation of PCT International Search Report).

*Primary Examiner* — Kaitlin S Joerger
(74) *Attorney, Agent, or Firm* — Fenwick & West LLP

(57) ABSTRACT

In a vacuum processing apparatus, a load lock module includes a housing and substrate holding sections, the housing having first substrate transfer ports formed on one of right and left sides thereof and a second substrate transfer port formed on a rear side thereof, and each substrate holding section being configured to hold a substrate on a right or left side in the housing. Further, a normal pressure transfer chamber extends over or under the housing from one of the right and left sides of the housing to the other one thereof so that each first substrate transfer port is opened. The normal pressure transfer chamber includes a stacked transfer region that is a region overlapping the housing. Further, a normal pressure transfer mechanism transfers the substrate between each substrate holding section and a
(Continued)

transfer container carried into each of loading/unloading ports via the stacked transfer region.

19 Claims, 12 Drawing Sheets

(51) Int. Cl.
  *H01L 21/68* (2006.01)
  *H01L 21/687* (2006.01)
(52) U.S. Cl.
  CPC .. *H01L 21/67201* (2013.01); *H01L 21/67766* (2013.01); *H01L 21/67775* (2013.01); *H01L 21/681* (2013.01); *H01L 21/6875* (2013.01); *H01L 21/68707* (2013.01)

(56) References Cited

U.S. PATENT DOCUMENTS

| | | | | |
|---|---|---|---|---|
| 2008/0105201 | A1* | 5/2008 | Ronan | H01L 21/68757 118/500 |
| 2009/0179366 | A1* | 7/2009 | Herchen | H01L 21/67126 269/21 |
| 2011/0168330 | A1* | 7/2011 | Sakaue | H01L 21/6875 156/345.31 |
| 2013/0025155 | A1* | 1/2013 | Kim | H01L 21/67028 34/516 |
| 2014/0004710 | A1* | 1/2014 | Sakata | H01L 21/02104 438/758 |
| 2014/0301818 | A1* | 10/2014 | Gilchrist | B25J 15/00 414/744.2 |
| 2015/0349668 | A1* | 12/2015 | Yamamoto | H01L 21/6833 361/234 |
| 2018/0261478 | A1* | 9/2018 | Ueda | G05D 7/0641 |
| 2018/0286716 | A1* | 10/2018 | Sakata | H01L 21/68707 |
| 2019/0115224 | A1* | 4/2019 | Lee | H01L 21/67115 |
| 2019/0267270 | A1* | 8/2019 | Furukawa | H01L 21/6875 |
| 2019/0311923 | A1* | 10/2019 | Kim | H01L 21/6708 |
| 2019/0385873 | A1* | 12/2019 | Yamagishi | H01L 21/67754 |
| 2020/0075376 | A1* | 3/2020 | Fukasawa | H01L 21/67742 |
| 2020/0205234 | A1* | 6/2020 | Lee | H01L 21/67103 |
| 2021/0035843 | A1* | 2/2021 | Li | H01L 21/6833 |
| 2021/0143035 | A1* | 5/2021 | Sakaue | H01L 21/67201 |

\* cited by examiner

VACUUM PROCESSING APPARATUS AND SUBSTRATE TRANSFER METHOD

TECHNICAL FIELD

Exemplary embodiments of the present disclosure relate to a vacuum processing apparatus and a substrate transfer technique.

BACKGROUND

A vacuum processing apparatus which performs vacuum processing in a semiconductor device manufacturing process includes a load lock module switchable between a normal pressure atmosphere and a vacuum atmosphere, and transfers a semiconductor wafer (hereinafter referred to as a "wafer") which is accommodated in a transfer container and transferred, to the load lock module via a normal pressure transfer chamber. Then, after the inside of the load lock module is switched from the normal pressure atmosphere to the vacuum atmosphere, the wafer is transferred to, for example, each of a plurality of vacuum processing units via a vacuum transfer chamber.

For instance, Patent Document 1 below discloses a vacuum processing apparatus including a processing module for processing two wafers W arranged horizontally, in which two substrates are arranged side by side in a load lock module switchable between a normal pressure atmosphere and a vacuum atmosphere. In this vacuum processing apparatus, two wafers can be delivered in parallel between the load lock module and the processing module by a transfer arm.

RELATED ART

Patent Document 1: Japanese Patent Application Publication No. 2013-171872

SUMMARY

The present disclosure is made in consideration of such circumstances, and is directed to providing a technique for preventing an increase in a footprint of a vacuum processing apparatus which processes a substrate under a vacuum atmosphere.

In accordance with an aspect of the present disclosure, there is provided a vacuum processing apparatus comprising: a load lock module including a housing and a plurality of substrate holding sections, the inside of the housing being switchable between a normal pressure atmosphere and a vacuum atmosphere, the housing having openable/closeable first substrate transfer ports formed on one of right and left sides thereof and an openable/closeable second substrate transfer port formed on a rear side thereof, and each of the plurality of substrate holding sections being configured to hold a substrate on a right or left side in the housing; a vacuum transfer chamber having a vacuum atmosphere, the vacuum transfer chamber being connected to the rear side of the housing and the second substrate transfer port being opened to the vacuum transfer chamber; a processing module, connected to the vacuum transfer chamber, for vacuum-processing the substrate; a vacuum transfer mechanism configured to transfer the substrate between the load lock module, the vacuum transfer chamber, and the processing module; a normal pressure transfer chamber having a normal pressure atmosphere, the normal pressure transfer chamber extending over or under the housing from one of the right and left sides of the housing to the other one thereof so that each of the first substrate transfer ports is opened, the normal pressure transfer chamber including a stacked transfer region, and the stacked transfer region being a region overlapping the housing to which the substrate is transferred; a plurality of loading/unloading ports, provided on right and left outer sides of the normal pressure transfer chamber, for loading or unloading a transfer container accommodating the substrate; and a normal pressure transfer mechanism configured to transfer the substrate between each of the substrate holding sections and the transfer container carried into each of the loading/unloading ports via the stacked transfer region.

Effect of the Invention

According to the present disclosure, an increase in a footprint of a vacuum processing apparatus which processes a substrate under a vacuum atmosphere can be prevented.

DETAILED DESCRIPTION

First Embodiment

Figure 1:
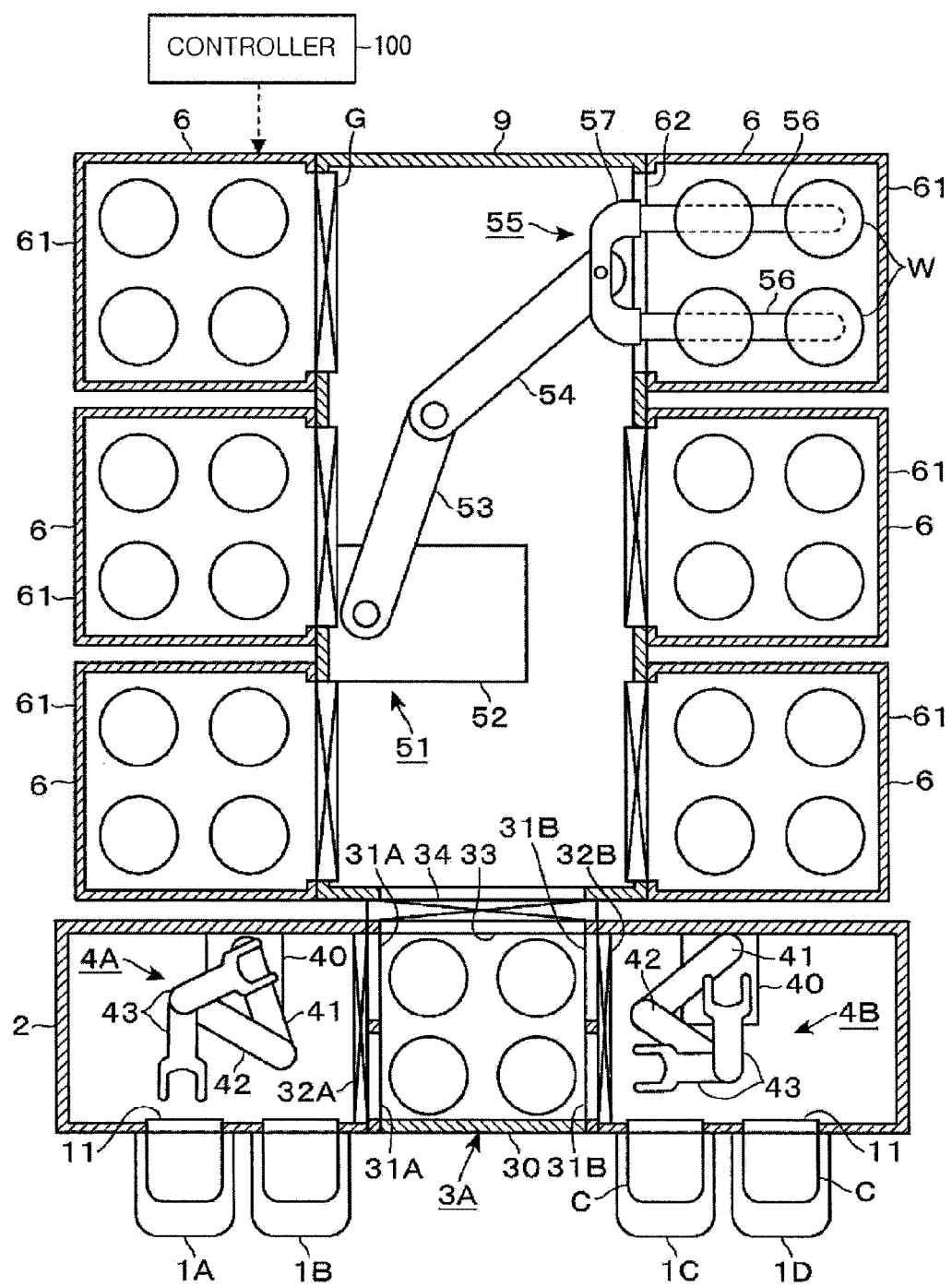
FIG. 1 is a plan view illustrating a vacuum processing apparatus according to a first embodiment.
Figure 2:
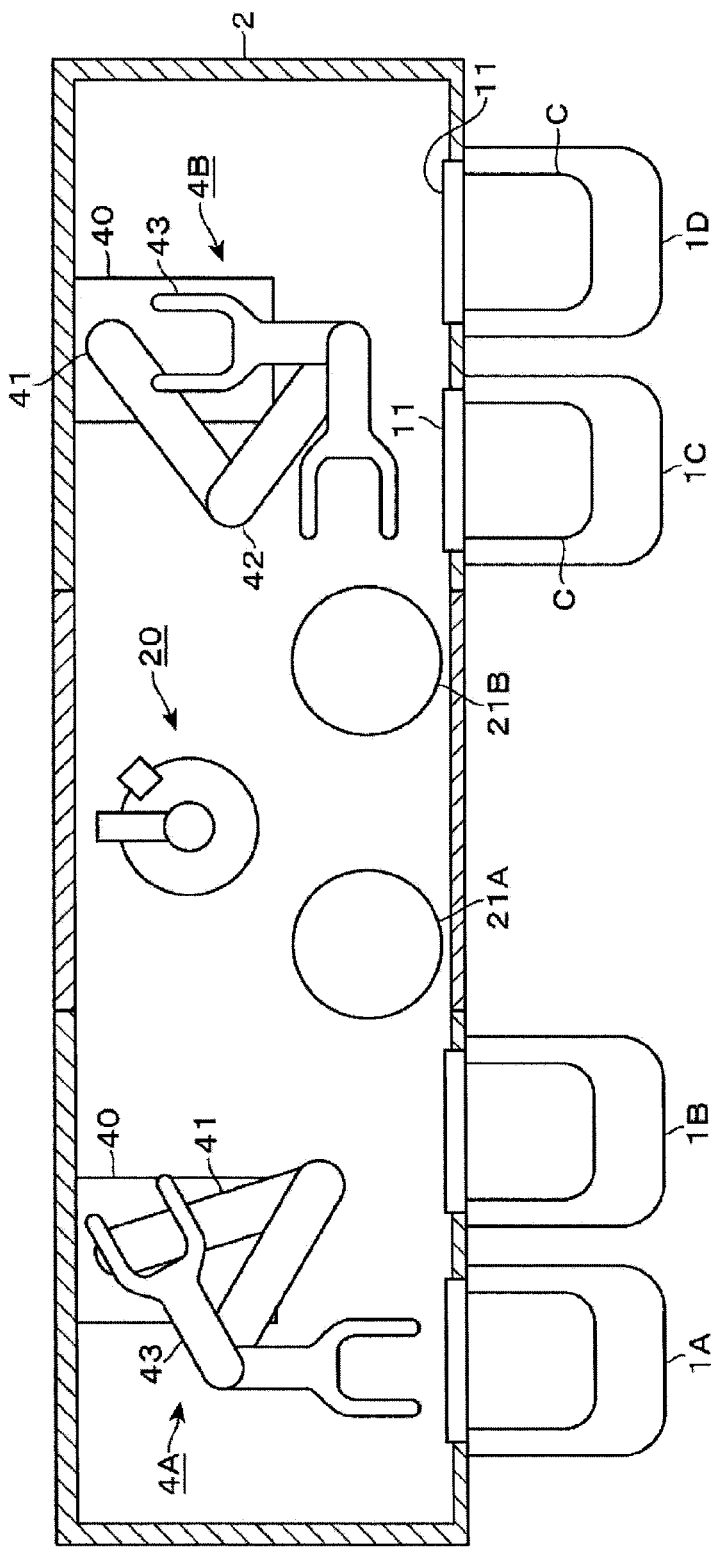
FIG. 2 is a plan view of a portion of a normal pressure transfer chamber.
Figure 3:
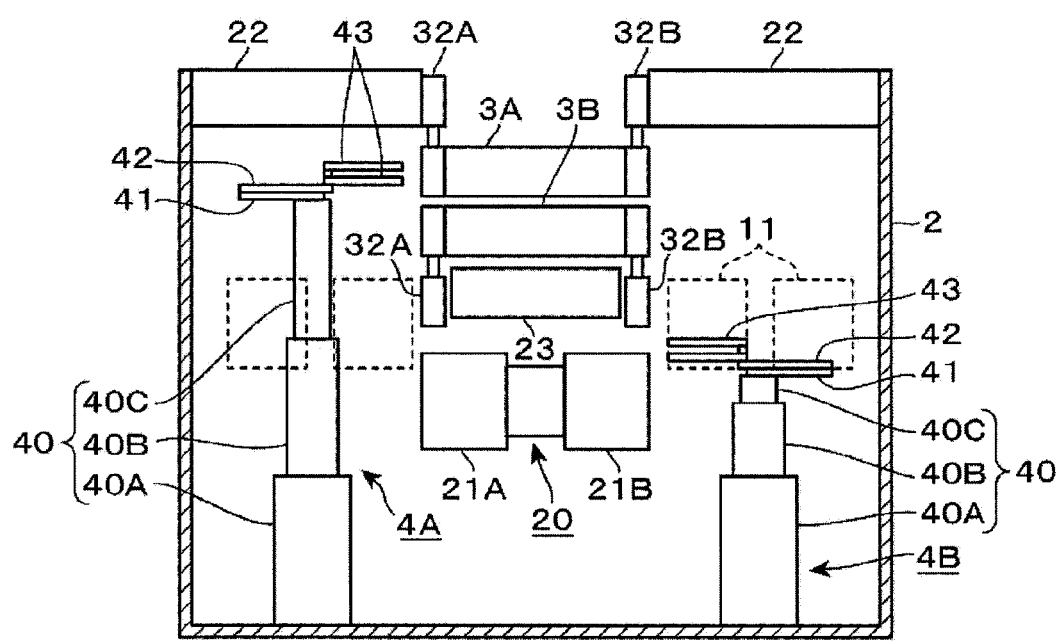
FIG. 3 is a longitudinal cross-sectional view of the normal pressure transfer chamber.

A vacuum processing apparatus according to an embodiment will be described. As illustrated in FIGS. 1 to 3, the vacuum processing apparatus includes a rectangular normal pressure transfer chamber 2, wherein the normal pressure transfer chamber 2 has an inside made into a normal pressure atmosphere (in the case of air, it can be also called an atmospheric atmosphere) by clean air, for example, a dry gas, and extends in a left-right direction.

Further, the vacuum processing apparatus includes two load lock modules 3A and 3B stacked one above the other, and the normal pressure transfer chamber 2 is formed under the load lock modules 3A and 3B, extending from one of right and left sides of the load lock modules 3A and 3B to the other one thereof.

Further, a region below the load lock modules 3A and 3B in the normal pressure transfer chamber 2 is a transfer region for transferring a wafer W which is a substrate. The transfer region overlapping the load lock modules 3A and 3B corresponds to a stacked transfer region. Cooling modules 21A and 21B corresponding to substrate mounters and an alignment module 20 are provided in the region below the load lock modules 3A and 3B.

Four loading/unloading ports 1A to 1D for placing a carrier C which is a transfer container for the wafer W are provided in front of the normal pressure transfer chamber 2. Hereinafter, the side where the loading/unloading port 1A to 1D are provided will be referred to as a front side, and the side where the normal pressure transfer chamber 2 is provided will be referred to as a rear side. When the loading/unloading ports 1A to 1D are viewed from the front side, two loading/unloading ports are disposed on the left side of the load lock modules 3A and 3B, the other two loading/unloading ports are disposed on the right side of the load lock modules 3A and 3B, and the loading/unloading ports are disposed in the order of 1A, 1B, 1C, and 1D from left to right. Further, as illustrated in FIG. 3, the loading/unloading ports 1A to 1D are installed so that the carrier C placed in the loading/unloading ports 1A to 1D is located at a height between the load lock modules 3A and 3B and the cooling modules 21A and 21B together with the alignment module 20. A reference numeral 11 in FIGS. 1 and 2 refers to a door which is opened together with a lid of the carrier C.

Further, as illustrated in FIG. 3, in the normal pressure transfer chamber 2, a first normal pressure transfer mechanism 4A and a second normal pressure transfer mechanism 4B are respectively provided at the left and right bottom regions, with the cooling modules 21A and 21B, the alignment module 20, and the load lock modules 3A and 3B interposed therebetween. When viewed from the front side, the first normal pressure transfer mechanism 4A is disposed on the left side, and the second normal pressure transfer mechanism 4B is disposed on the right side. The first normal pressure transfer mechanism 4A is dedicated to delivery of the wafer W of the carrier C transferred to the loading/unloading ports 1A and 1B of the loading/unloading ports 1A to 1D. The second normal pressure transfer mechanism 4B is dedicated to delivery of the wafer W of the carrier C transferred to the loading/unloading ports 1C and 1D of the loading/unloading ports 1A to 1D.

Since the first normal pressure transfer mechanism 4A and the second normal pressure transfer mechanism 4B have substantially the same configuration, the first normal pressure transfer mechanism 4A will be described as an example. The first normal pressure transfer mechanism 4A is configured as a joint arm comprising a lower stage arm section 41 and an upper stage arm section 42 connected with each other via a rotation shaft (not illustrated). Further, two fork-shaped support fork sections 43 each holding the wafer W are connected to a distal end of the upper stage arm section 42 via the rotation shaft. The two support fork sections 43 are configured to rotate independently from each other, and can each hold one wafer W on its distal end side.

As illustrated in FIG. 3, the first normal pressure transfer mechanism 4A includes a base 40 fixed to the bottom surface of the normal pressure transfer chamber 2. The base 40 includes a lower stage member 40A, a middle stage member 40B that can protrude or retract from the upper surface of the lower stage member 40A, and an upper stage member 40C that can protrude or retract from the upper surface of the middle stage member 40B, and a proximal end side of the lower stage arm section 41 is rotatably connected to the upper surface of the upper stage member 40C. Then, when the middle stage member 40B or the upper stage member 40C protrudes or retracts from the lower stage member 40A or the middle stage member 40B, the base 40 expands or contracts in a vertical direction and, thus, the height of the base 40 is changed and the height position of the support fork section 43 can be also changed. Moreover, due to the expansion and contraction of the base 40, the height position of the support fork section 43 is changed from a height position lower than a height position where the wafer W can be delivered to the alignment module 20 and the cooling modules 21A and 21B to be described later to a height position where the wafer W can be delivered to the load lock module 3A located a higher position.

Figure 4:
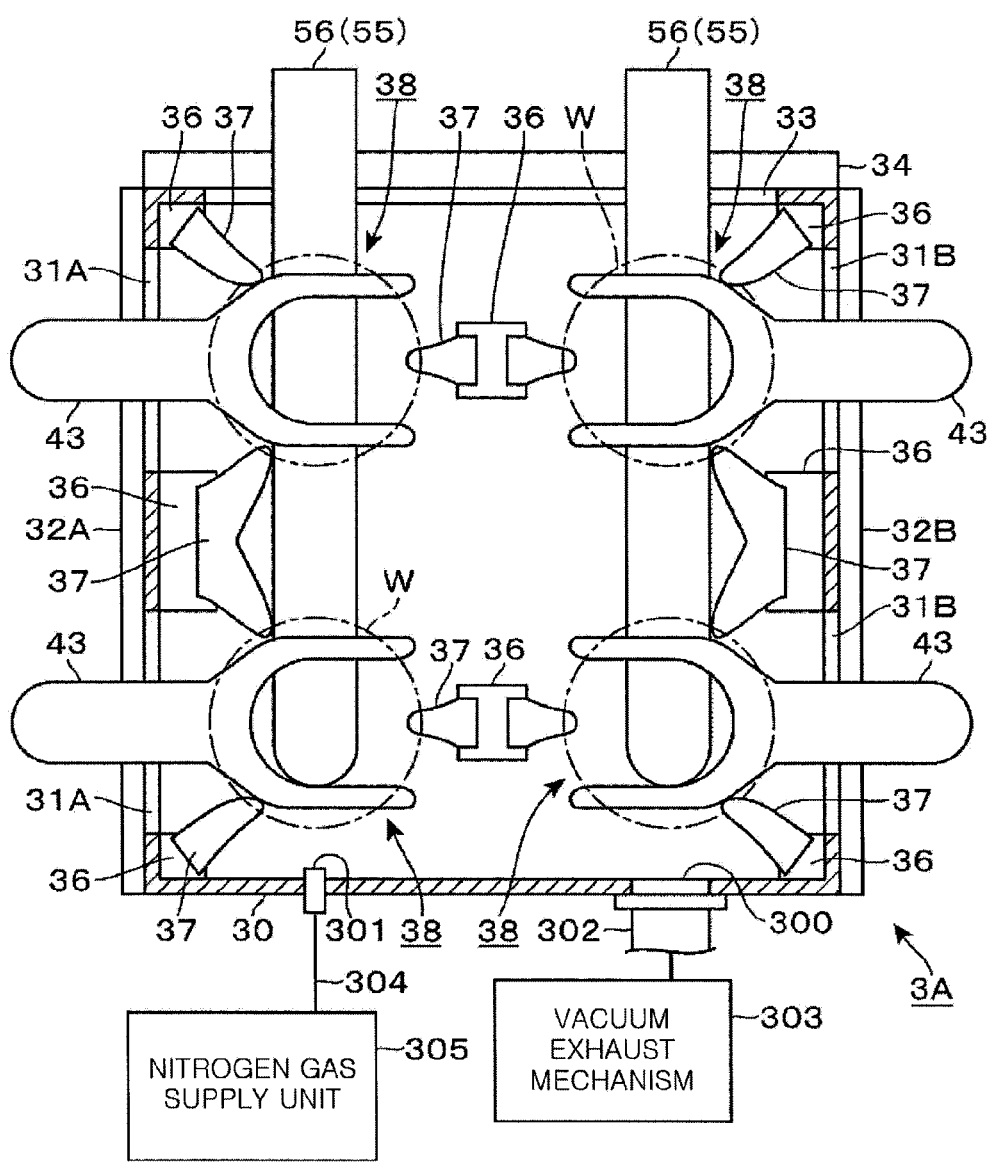
FIG. 4 is a plan view of a load lock module.

Next, the load lock modules 3A and 3B will be described. Since the load lock modules 3A and 3B are configured in substantially the same manner, the upper load lock module 3A will be described as an example. The load lock module 3A includes a housing 30, the inside of the housing being switchable between a normal pressure atmosphere and a vacuum atmosphere. As illustrated in FIGS. 1 and 4, the housing 30 is formed in a flat rectangular shape, and the front wall and the rear wall of the housing 30 are formed to be substantially aligned with the front wall and the rear wall of the normal pressure transfer chamber 2, respectively.

Figure 5:
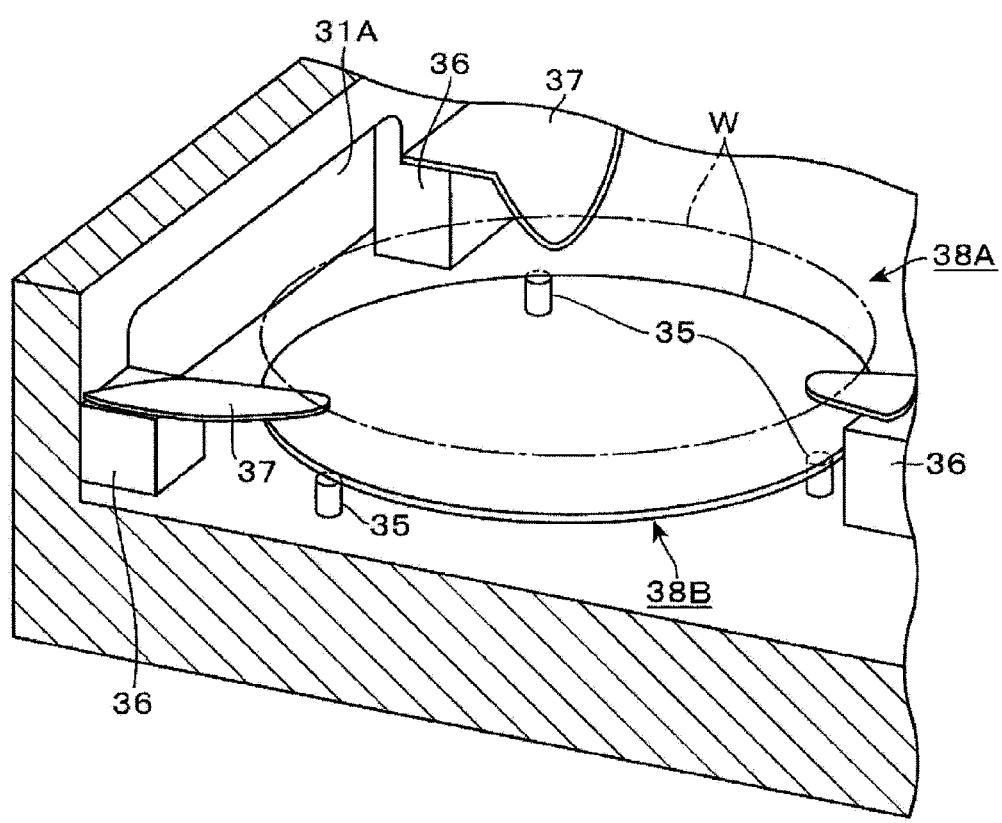
FIG. 5 is a perspective view showing a substrate support of the load lock module.

In the housing 30, four shelves 38 each configured to hold two wafers W are provided in two columns from left to right and two rows from front to back. As illustrated in FIG. 5, each shelf 38 includes a lower stage wafer holding section 38B which supports a peripheral edge of the wafer W from below by three support pins 35 protruding upward from the bottom surface of the housing 30. Further, the shelf 38 includes an upper stage wafer holding section 38A which supports a lower peripheral edge of the wafer W from above the wafer W held by the lower stage wafer holding section 38B by three support beams 37 extending horizontally from the upper surface of a pedestal section 36 provided on the bottom surface of the housing 30. Each support beam 37 supports the peripheral edge of the wafer W at its distal end, and is arranged so that distal end portions of the support beams 37 are aligned above the support pins 35. Each shelf 38 corresponds to a substrate holding section.

A left transfer path 31A where the first normal pressure transfer mechanism 4A enters is formed in the left surface of the housing 30 at a position corresponding to the wafer W held by the left shelf 38 when viewed from the front side. A right transfer path 31B where the second normal pressure transfer mechanism 4B enters is formed in the right surface of the housing 30 at a position corresponding to the wafer W held by the right shelf 38 when viewed from the front side. Gate valves 32A and 32B are provided in the left transfer path 31A and the right transfer path 31B, respectively. Therefore, the gate valves 32A and 32B open or close the left transfer path 31A and the right transfer path 31B, respectively. Each of the left transfer path 31A and the right transfer path 31B corresponds to a first substrate transfer port. Further, a rear transfer path 33 which is coupled to a vacuum transfer chamber 9 to be described later and into which a vacuum transfer mechanism 51 provided in the vacuum transfer chamber 9 enters is provided in the rear side surface of the housing 30. A gate valve 34 is provided in the rear transfer path 33. The rear transfer path 33 corresponds to the second substrate transfer port. Therefore, the gate valve 34 opens or closes the rear transfer path 33.

Hereinafter, unless otherwise specified, the left side and the right side refer to a side on left and a side on right when viewed from the front side. Among the wafer holding sections 38A and 38B, the wafer W is delivered to the left wafer holding sections 38A and 38B by the first normal pressure transfer mechanism 4A, and the wafer W is delivered to the right wafer holding sections 38A and 38B by the second normal pressure transfer mechanism 4B. By raising or lowering the support fork sections 43 of the first normal pressure transfer mechanism 4A and the second normal pressure transfer mechanism 4B with respect to the wafer holding section 38A and the wafer holding section 38B, the wafer W is delivered between the support fork section 43 and the wafer holding sections 38A and 38B. A position where the support fork section 43 is raised or lowered in order to deliver the wafer W to the wafer holding sections 38A and 38B in the housing 30 is referred to as a delivery position of the wafer W. As illustrated in FIG. 4, the three support beams 37 are provided so that the support beam 37 and the support fork section 43 do not interfere with each other when the support fork section 43 enters the delivery position of the wafer W and is raised or lowered. Further, since the support pins 35 are disposed so as to be aligned below the distal end portions of the support beams 37, when the support fork section 43 is raised or lowered to the delivery position of the wafer W, the support pin 35 and the support fork section 43 do not interfere with each other. Since the wafer W transferred from the vacuum transfer chamber 9 has been subjected to a film forming process, there is a concern that the wafer may be a particle generation source. Accordingly, the upper stage wafer holding section 38A holds the wafer W transferred from the normal pressure transfer chamber 2, and the lower stage wafer holding section 38B holds the wafer W transferred from the vacuum transfer chamber 9 to be described later.

Further, each load lock module 3A includes an exhaustion port 300 and a gas supply port 301 on its front side surface. One end of an exhaustion pipe 302 is connected to the exhaustion port 300 from the front side of the normal pressure transfer chamber 2, and a vacuum exhaust mechanism 303 for switching the inside of the housing 30 to a vacuum atmosphere is connected to the other end of the exhaustion pipe 302. Further, one end of a gas supply pipe 304 is connected to the gas supply port 301 from the front side of the housing 30, and a nitrogen gas supply unit 305 for supplying a nitrogen gas into the housing 30 and switching the inside of the housing 30 to a normal pressure atmosphere is connected to the other end of the gas supply pipe 304.

Figure 6:
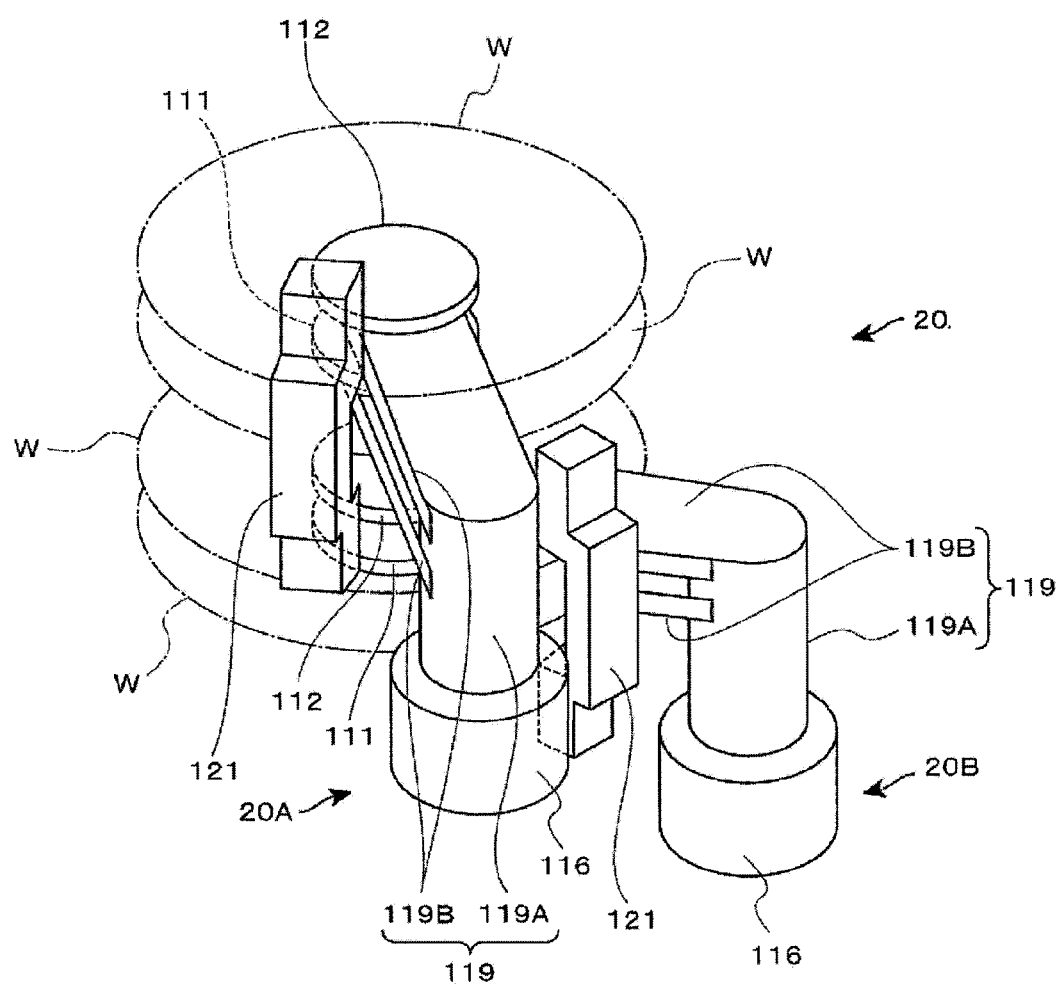
FIG. 6 is a perspective view describing an alignment module.

Next, the alignment module 20 will be described. As illustrated in FIG. 2, the alignment module 20 is provided at a position near the lower rear side of the load lock module 3B. As illustrated in FIG. 6, the alignment module 20 includes two alignment mechanisms 20A and 20B respectively holding and positioning two wafers W vertically. Hereinafter, an upper alignment mechanism is denoted by a reference numeral 20A, and a lower alignment mechanism is denoted by a reference numeral 20B. The alignment mechanisms 20A and 20B are configured in a same manner, and the alignment mechanism 20A will be described as a representative example. The alignment mechanism 20A includes substrate mounters 111 and 112 for the wafer W which are vertically spaced apart from each other and are provided so as to overlap each other in a plan view.

As illustrated in FIG. 6, each of the substrate mounters 111 and 112 is supported by a housing 119 via a rotation shaft (not illustrated). The housing 119 includes a vertical section 119A and a horizontal section 119B extending horizontally from the vertical section 119A in two upper and lower stages, and the substrate mounters 111 and 112 are supported by lower and upper stages of the horizontal section 119B, respectively. A pulley, a timing belt, and a motor (not illustrated) are provided in the housing 119, and are configured to rotate the substrate mounters 111 and 112 about a vertical axis via a rotation shaft.

A reference numeral 121 of FIG. 6 denotes a light detector, and two laterally protruding pieces constituting the light detector 121 are formed to interpose the peripheral edge of the wafers W placed on the substrate mounters 111 and 112 in the vertical direction. The two protruding pieces are configured as a transmissive optical sensor facing each other, an upper protruding piece forms a light emitter, a lower protruding piece forms a light receiver, and irradiation of light is performed vertically downward from the light emitter to the light receiver.

During the rotation of the wafer W by the substrate mounters 111 and 112, the light irradiation is performed to detect the position of the wafer W. In some cases, the "detection" may be referred to as "positioning". For example, the position of the wafer W detected in this way includes a position of a cutout (notch) formed in the peripheral edge of the wafer W and a position of the peripheral edge of the wafer W. Both the substrate mounters 111 and 112 of each of the alignment mechanisms 20A and 20B are disposed at the lateral center of the normal pressure transfer chamber 2 so as to deliver the wafer W from both the first normal pressure transfer mechanism 4A and the second normal pressure transfer mechanism 4B. With respect to the wafer W, the position of which is detected as described above, the first normal pressure transfer mechanism 4A and the second normal pressure transfer mechanism 4B receive (position) the wafer W so that the wafer W faces a predetermined direction on the support fork section 43 and is located at a predetermined position.

Returning to FIG. 2, the cooling modules 21A and 21B are provided to be aligned side by side in front of the alignment module 20 in the normal pressure transfer chamber 2. The cooling module 21A is provided on a left side of the lateral center of the normal pressure transfer chamber 2, and the cooling module 21B is provided on a right side of the lateral center of the normal pressure transfer chamber 2. The cooling modules 21A and 21B include a shelf-shaped substrate mounter (not illustrated) on which a plurality of wafers W are placed in the vertical direction, and the wafer W placed on the substrate mounter is exposed to an air flow formed by a Fan Filter Unit (FFU) 23 to be described later and cooled down. In the left cooling module 21A, the delivery of the wafer W is performed by the first normal pressure transfer mechanism 4A, and in the right cooling module 21B, the delivery of the wafer W is performed by the second normal pressure transfer mechanism 4B.

As illustrated in FIG. 3, Fan Filter Units (FFU) 22 for generating a downflow in the normal pressure transfer chamber 2 are provided on right and left ceiling surfaces in the normal pressure transfer chamber 2, with the load lock modules 3A and 3B interposed therebetween. In a region below the load lock module 3B, the downflow generated by the FFU 22 provided on the ceiling surface of the normal pressure transfer chamber 2 may be blocked by the load lock modules 3A and 3B. Therefore, the FFU 23 which supplies the gas constituting the atmosphere of the normal pressure transfer chamber 2 downward to generate a downflow is provided on the ceiling of the normal pressure transfer chamber 2 below the load lock module 3B.

As illustrated in FIG. 1, the vacuum transfer chamber 9 is connected to rear sides of the load lock modules 3A and 3B via the rear transfer path 33, the inside thereof being a vacuum atmosphere. The vacuum transfer chamber 9 is formed in a substantially rectangular shape extending in a front-rear direction, and three processing modules 6 are provided to be aligned in the front-rear direction on each of right and left sides of the vacuum transfer chamber 9 when viewed from the front side.

Further, as illustrated in FIG. 1, the vacuum transfer mechanism 51 for the wafer W, which is an articulated arm, is provided in the vacuum transfer chamber 9. The vacuum transfer mechanism 51 includes a base 52, a first arm 53 extending horizontally, a second arm 54 extending horizontally, and a wafer support 55. The base 52 is provided closer to the left with respect to the center in the front-rear direction of a floor in the vacuum transfer chamber 9, and is configured to be raised or lowered. A base side of the first arm 53 is provided on the base 52 and the first arm 53 turns about a vertical turning axis on the base 52, while a base side of the second arm 54 is provided on a distal end portion of the first arm 53 and the second arm 54 turns about a vertical turning axis on the distal end portion of the first arm 53. The wafer support 55 includes two elongated spatula-shaped support main bodies 56 which extend horizontally in parallel with each other and a connection section 57 which extends horizontally to be orthogonal to the extension direction of the support main body 56 and connects proximal ends of the two support main bodies 56 to each other. The central section of the connection section 57 in a length direction is provided on the distal end portion of the second arm 54, and turns about a vertical turning axis on the distal end portion of the second arm 54.

As illustrated in FIG. 1, back surfaces of the wafers W are supported on a distal end side and a proximal end side of one support main body 56 at a certain interval from each other. Therefore, the wafer support 55 of the vacuum transfer mechanism 51 can transfer four wafers W at once. Further, as illustrated in FIG. 4, when the wafer support 55 enters the load lock modules 3A and 3B and the wafer support 55 is raised or lowered to the delivery position of the wafer W, the support beam 37 and the wafer support 55 are disposed so as not to interfere with each other. Since the support pin 35 is disposed below the distal end of the support beam 37 as described above, the wafer support 55 and the support pin 35 are disposed so as not to interfere with each other.

Therefore, in a state where the wafer support 55 supports four wafers W, the wafer support 55 is lowered from a position above the support beam 37 to a position below the support beam 37 at the wafer delivery position, and, thus, the four wafers W held by the wafer support 55 are collectively delivered to the upper stage wafer holding section 38A. Further, in a state where the wafers W are held by the upper stage wafer holding sections 38A at four locations, the wafer support 55 is raised from a position below the support beam 37 to a position above the support beam 37 at the wafer delivery position, and, thus, the four wafers W held by the upper stage wafer holding section 38A are collectively delivered to the wafer support 55. Similarly, in the lower stage wafer holding section 38B, four wafers W are collectively delivered to and from the wafer support 55.

Figure 7:
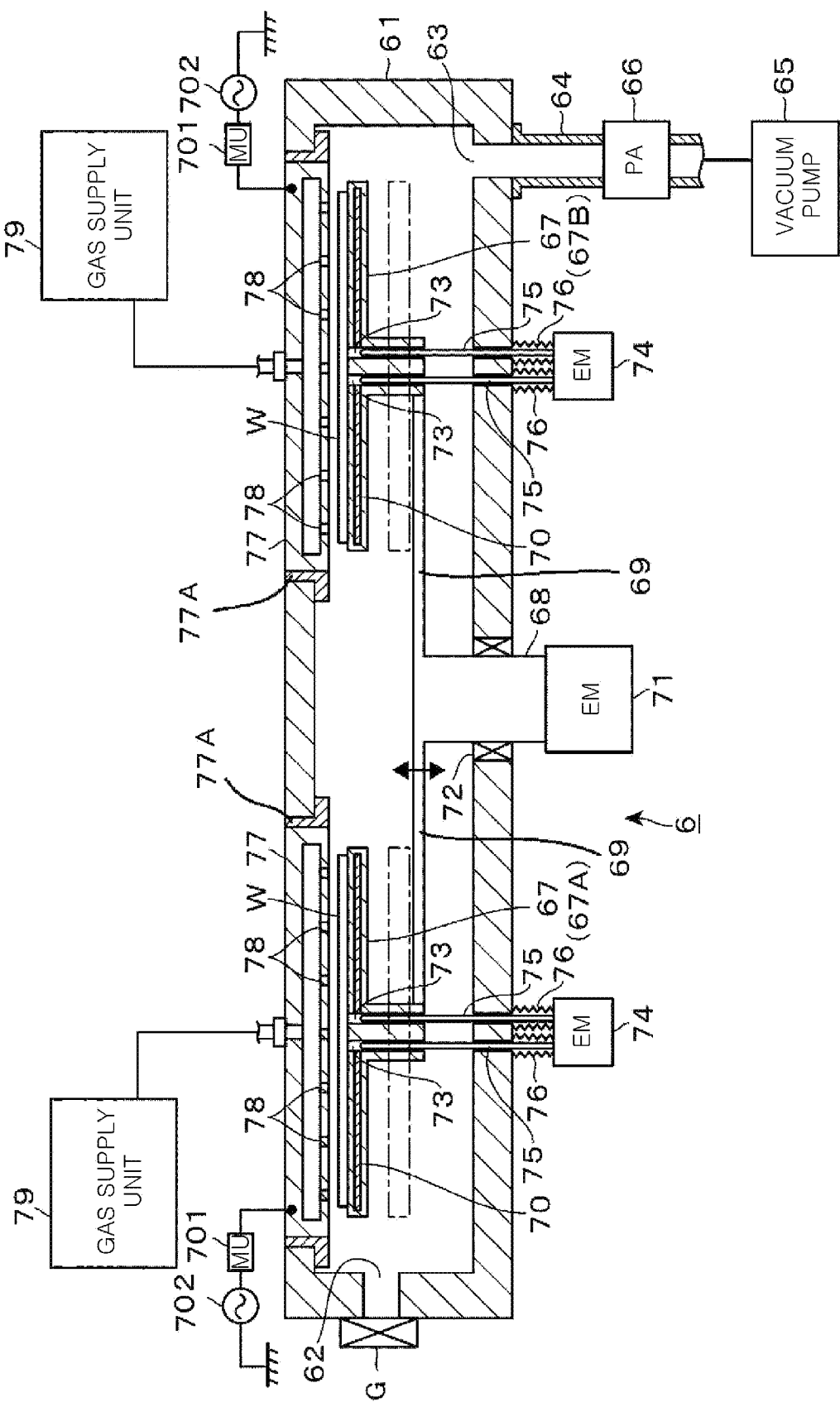
FIG. 7 is a longitudinal cross-sectional view representing a processing module.

Next, the processing module 6 will be described with reference to a longitudinal cross-sectional view of FIG. 7. Each of six processing modules 6 is a film forming module for forming a film on the wafer W by plasma Atomic Layer Deposition (ALD), all six processing modules are configured in the same manner, and the wafers W can be processed in parallel by the processing modules 6. The processing module includes a rectangular vacuum container (processing container) 61 in a plan view (refer to FIG. 1), and a transfer port 62 for the wafer W openable or closeable by a gate valve G opens in a side wall of the vacuum container 61. A reference numeral 63 in FIG. 7 is an exhaustion port opened at the bottom surface of the vacuum container 61, and the exhaustion port 63 is connected to a vacuum pump 65 via an exhaustion pipe 64. A reference numeral 66 in FIG. 7 is a pressure adjusting unit (PA) provided in the exhaustion pipe 64.

In the vacuum container 61, substrate mounters 67A and 67B on which the wafer W is placed are provided front to back in a row when viewed from the transfer port 62, and the rows of the substrate mounters 67A and 67B are arranged side by side when viewed from the transfer port 62. When viewed in a plane, a total of four wafers W are placed in the vacuum container 61 in a 2×2 matrix, and gaps between the four wafers W supported by the wafer support 55 are set according to a gap between the substrate mounters 67A and 67B. A reference numeral 70 in FIG. 7 is a heater embedded in each of the substrate mounters 67A and 67B, and the heater 70 heats each wafer W placed on the substrate mounters 67A and 67B to 300° C. to 450° C.

A reference numeral 68 in FIG. 7 is a support column passing through the central section of the bottom surface of the vacuum container 61, and four support arms 69 extend horizontally radially from the upper end of the support column 68 and support the substrate mounters 67A and 67B from below. the lower end side of the support column 68 is connected to an elevating mechanism (EM) 71 from a lower outer side of the vacuum container 61, and the substrate mounters 67A and 67B are raised or lowered between a processing position of the wafer W indicated by solid lines in FIG. 7 and the delivery position of the wafer W indicated by chain lines in FIG. 7 via the support column 68 and the support arm 69 by the elevating mechanism 71. Moreover, a reference numeral 72 in FIG. 7 is a seal member for maintaining the inside of the vacuum container 61 airtight.

Three through holes 73 are formed in each of the substrate mounters 67A and 67B, and an elevating pin 75 which is raised or lowered to deliver the wafer W to and from the vacuum transfer mechanism 51 is provided in each through hole 73 and, thus, can be raised or lowered by an elevating mechanism (EM) 74. The elevating pin 75 is disposed so as not to interfere with the wafer support 55 when the wafer W is delivered to the substrate mounters 67A and 67B. As described above, the substrate mounters 67A and 67B are disposed according to the positions of the four wafers W held by the wafer support 55. Therefore, when the wafer support 55 enters the deliver position of the wafer W and the wafers W are delivered by a cooperative operation of the wafer support 55 and the elevating pin, the four wafers W can be collectively delivered between the wafer support 55 and each of the substrate mounters 67A and 67B. A reference numeral 76 in FIG. 7 is a bellows for ensuring airtightness in the vacuum container 61.

A gas shower head 77 is provided above each of the substrate mounters 67A and 67B in the ceiling of the vacuum container 61 via an insulating member 77A. The lower surface of the gas shower head 77 faces each of the substrate mounters 67A and 67B, and a plurality of gas discharge holes 78 are dispersedly disposed in the lower surface. A high frequency power supply 702 is connected to the gas shower head 77 via a matching unit (MU) 701. Further, a lower electrode (not illustrated) is embedded in each of the substrate mounters 67A and 67B, and the lower electrode is connected to the ground potential. A reference numeral 79 in FIG. 7 is a gas supply unit which independently supplies titanium tetrachloride (TiCl$_4$) gas, hydrogen (H$_2$) gas, ammonia (NH$_3$) gas, argon (Ar) gas, and nitrogen (N$_2$) gas to the gas shower head 77, and the gas is discharged from the gas discharge holes 78.

The film forming process of the wafer W by the processing module 6 is as follows: after the wafers W are placed on the two substrate mounters 67A and the two substrate mounters 67B located at the delivery positions, the wafers W are heated by the heater 70, and simultaneously, the substrate mounters 67A and 67B are raised and moved to the processing position. Next, TiCl$_4$ gas is supplied from the gas shower head 77 as a gas for film formation and adsorbed on the surface of the wafer W. Further, Ar gas and H$_2$ gas are supplied to the wafer W as a reaction gas. Further, high frequency power is applied from the high frequency power supply 702 to between the gas shower head 77 and the lower electrode in each of the substrate mounters 67A and 67B, and thus the supplied reaction gas is converted into plasma by capacitive coupling. Accordingly, the TiCl$_4$ gas and the H$_2$ gas are activated and react with each other, and a Ti (titanium) layer is formed on the surface of the wafer W. Each of the substrate mounters 67A and 67B and the gas shower head 77 corresponding to each of the substrate mounters 67A and 67B constitute a substrate processing unit.

In this way, the adsorption of TiCl$_4$ gas, the supply of Ar gas and H$_2$ gas, and the plasma conversion of the reaction gas are sequentially repeated a plurality of times. As a result, the formation of the Ti layer is repeated, and a Ti film having a desired film thickness is formed.

As illustrated in FIG. 1, the vacuum processing apparatus includes a controller 100 which controls the transfer of the wafer W in the vacuum processing apparatus, the film formation processing in the processing module 6, and the switching of the atmosphere in each of the load lock modules 3A and 3B. The controller 100, for example, includes a computer having a CPU and a storage unit (not illustrated), and a program in which a recipe for the film formation processing in the processing module 6 and a group of steps (commands) for transferring the wafer W by the normal pressure transfer mechanisms 4A and 4B and the vacuum transfer mechanism 51 in the vacuum processing apparatus are assembled is recorded in the storage unit. The program is stored on, for instance, a storage medium such as a hard disk, a compact disk, a magnetic optical disk, or a memory card, and is installed in the computer from the storage medium.

Next, an operation of the above-described embodiment will be described. For the sake of convenience, in FIGS. 8 to 13, the loading/unloading ports 1A and 1C among the loading/unloading ports 1A to 1D are illustrated on the left and right sides of the normal pressure transfer chamber 2, respectively, and the alignment module 20 and the cooling modules 21A and 21B are illustrated as being disposed vertically. The loading/unloading ports 1B and 1D are not illustrated for the sake of convenience. Further, in FIGS. 8 to 13, the wafers W are illustrated in a maximum of four stages in the load lock modules 3A and 3B. Among the wafers W of the four stages, the wafers W of two upper stages indicate the wafers W of the wafer holding section 38A, that is, the wafers W held on the upper side of the module, and the wafers W of two lower stages indicate the wafers W of the wafer holding section 38B, that is, the wafers W held on the lower side of the module. Further, in FIGS. 10 to 13, the wafers W processed in the processing module 6 are indicated by hatched lines.

Figure 8:
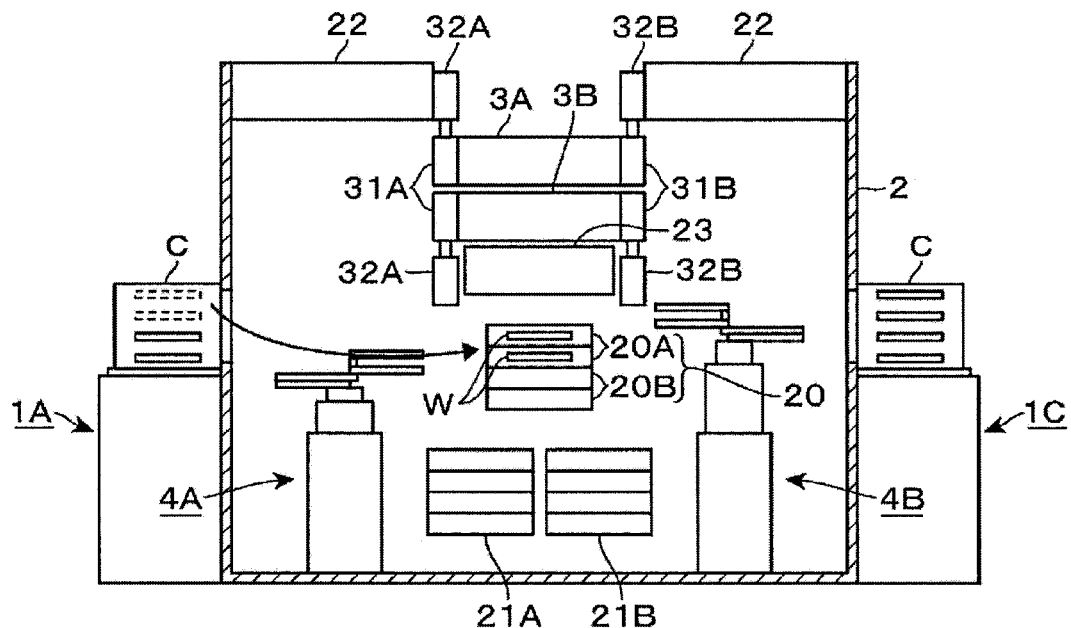
FIG. 8 is an explanatory diagram depicting an operation of the first embodiment.

As illustrated in FIG. 8, when the carrier C accommodating an unprocessed wafer W is placed in the loading/unloading ports 1A to 1D, four unprocessed wafers W in the carrier C placed in the loading/unloading ports 1A and 1B on the left side when viewed from the front side, for example, are taken out by the first normal pressure transfer mechanism 4A and transferred to the alignment module 20. In this way, the unprocessed wafer W transferred to the load lock modules 3A and 3B is placed on the alignment module 20, and thus the alignment module 20 corresponds to a pre-processing substrate mounter.

Figure 9:
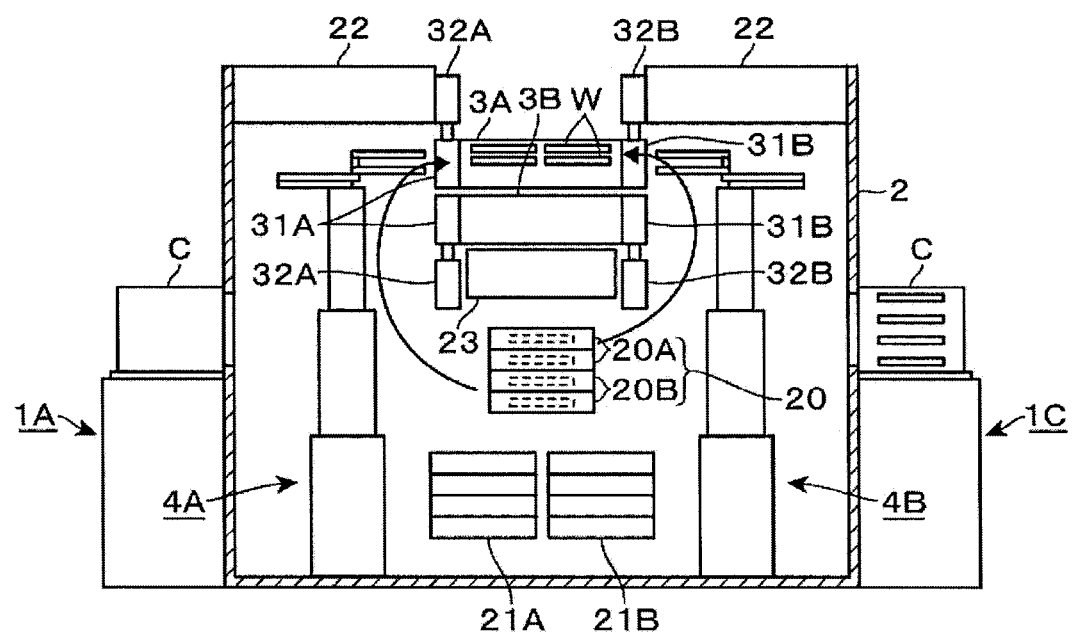
FIG. 9 is an explanatory diagram explaining the operation of the first embodiment.

Then, the four wafers W are positioned by the alignment module 20. Next, as illustrated in FIG. 9, among the four wafers W placed on the alignment module 20, for example, the second normal pressure transfer mechanism 4B receives two wafers W placed on the upper alignment mechanism 20A. Further, the first normal pressure transfer mechanism 4A receives two wafers W of the lower alignment mechanism 20B.

Moreover, the left and right gate valves 32A and 32B of the upper load lock module 3A are opened. Then, the first normal pressure transfer mechanism 4A enters the load lock module 3A from the left transfer path 31A, and two wafers W are delivered to the upper stage wafer holding sections 38A of two shelves 38 in the left row. Further, the second normal pressure transfer mechanism 4B enters the load lock module 3A from the right transfer path 31B, and two wafers W are delivered to the upper stage wafer holding section 38A of two shelves 38 in the right row. By positioning the four wafers W in this way, two wafers each can be transferred in parallel by the first normal pressure transfer mechanism 4A and the second normal pressure transfer mechanism 4B, and thus transfer time is shortened.

When the four wafers W are carried into the upper load lock module 3A, the first normal pressure transfer mechanism 4A and the second normal pressure transfer mechanism 4B are retracted from the load lock module 3A. Further, the left and right gate valves 32A and 32B of the load lock module 3A are closed, and the inside of the load lock module 3A is switched to a vacuum atmosphere. After the inside is switched to the vacuum atmosphere, the gate valve 34 on the vacuum transfer chamber 9 side of the upper load lock module 3A is opened to allow the vacuum transfer mechanism 51 to enter the load lock module 3A. At this moment, the wafer support 55 of the vacuum transfer mechanism 51 enters below the wafer W placed on the upper stage wafer holding section 38A of each shelf 38 of the load lock module 3A. Further, by raising the wafer support 55, a total of four wafers W placed on each wafer holding section 38A are collectively lifted up by the wafer support 55.

The processing modules 6 connected to the left and right sides of the vacuum transfer chamber 9 are referred to as a front stage processing module, a middle stage processing module, and a rear stage processing module from the front side, and when the vacuum transfer mechanism 51 receives the wafer W, the vacuum transfer mechanism 51, in a state of holding the wafer W, enters the processing module 6, for example, the rear stage processing module 6 on the right side when viewed from the front side. Each wafer W held by the vacuum transfer mechanism 51 is located above the corresponding substrate mounters 67A and 67B, and the four wafers W are collectively delivered to the corresponding substrate mounters 67A and 67B by the cooperative operation of the elevating pin 75 of each of the substrate mounters 67A and 67B and the vacuum transfer mechanism 51.

Moreover, on the normal pressure transfer chamber 2 side, similarly, a subsequent wafer W is transferred to the alignment module 20 and further transferred to the lower load lock module 3B. Similarly, the inside of the load lock module 3B is switched to a vacuum atmosphere, and the four wafers W in the load lock module 3B are transferred to the processing module 6 by the vacuum transfer mechanism 51.

In this way, the wafers W are sequentially carried into the upper and lower load lock modules 3A and 3B, and the wafers W are transferred to respective processing modules 6 via the vacuum transfer chamber 9. Then, the wafers W are processed in respective processing modules 6 as described above.

After the wafers W are processed in respective processing modules 6, for example, the gate valve G of the rear stage processing module 6 on the right side when viewed from the front side is opened. Then, the processed wafers W placed on the four substrate mounters 67A and 67B are collectively received by the vacuum transfer mechanism 51. Thereafter, for example, the gate valve 34 of the upper load lock module 3A is opened, the wafer support 55 enters the load lock module 3A, and the four wafers W are collectively delivered to the lower stage wafer holding section 38B. After that, the wafer support 55 is retracted into the vacuum transfer chamber 9, the gate valve 34 is closed, and the atmosphere in the load lock module 3A is switched to the normal pressure atmosphere. Similarly, for example, the four wafers W of the rear stage processing module 6 on the left side when viewed from the front side are delivered to the lower stage wafer holding section 38B of the lower load lock module 3B. Furthermore, the atmosphere inside the load lock module 3B is switched to the normal pressure atmosphere.

In this case, in the normal pressure transfer chamber 2, the wafer W to be processed is subsequently taken out of the carrier C, and for example, positioned by the alignment module 20 and stands by.

Figure 10:
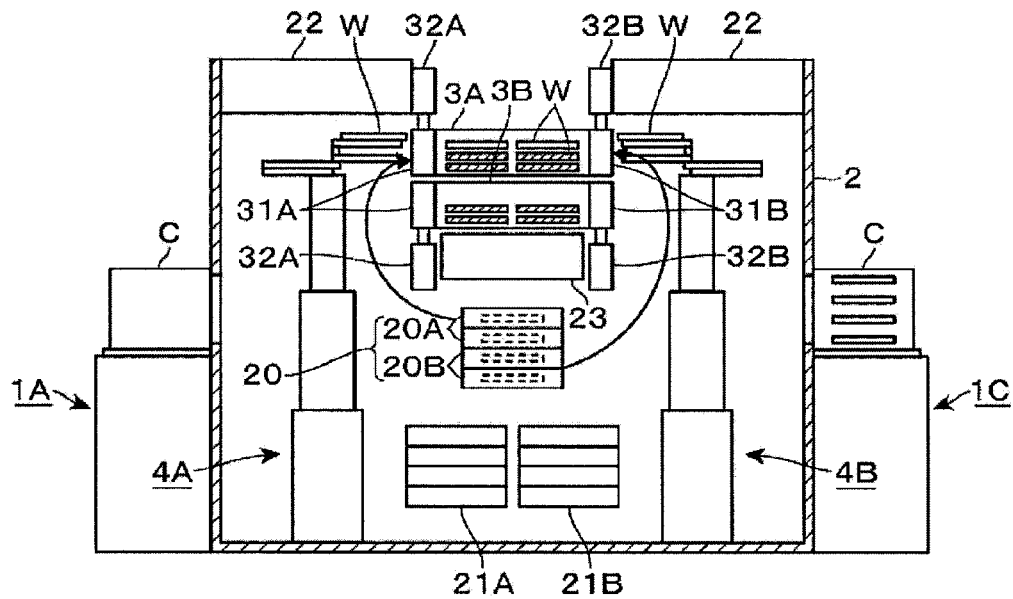
FIG. 10 is an explanatory diagram indicating the operation of the first embodiment.
Figure 11:
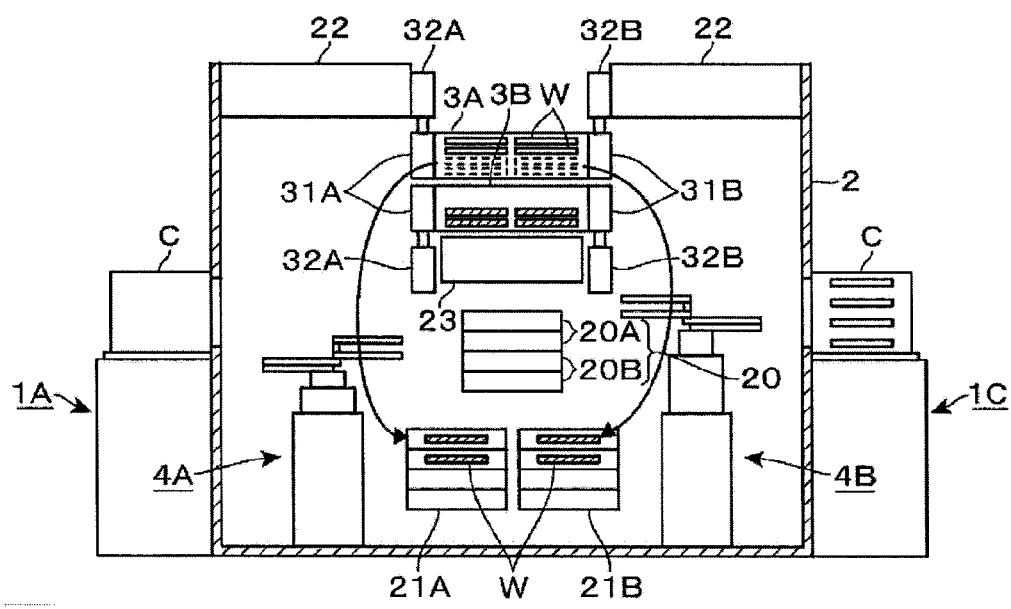
FIG. 11 is an explanatory diagram demonstrating the operation of the first embodiment.

Then, as illustrated in FIG. 10, each of the left and right gate valves 32A and 32B of the upper load lock module 3A is opened, in the same manner as when the unprocessed wafer W is first transferred to the load lock module 3A. Further, the first normal pressure transfer mechanism 4A and the second normal pressure transfer mechanism 4B deliver four unprocessed wafers W of the alignment module 20 to the upper stage wafer holding section 38A of the load lock module 3A. After that, as illustrated in FIG. 11, the first normal pressure transfer mechanism 4A receives two processed wafers W placed on the lower stage wafer holding section 38B in the left row of the load lock module 3A. Further, the second normal pressure transfer mechanism 4B receives two processed wafers W of the lower stage wafer holding section 38B in the right row of the load lock module 3A.

Moreover, the first normal pressure transfer mechanism 4A holds the processed wafer W and transfers it to the left cooling module 21A, and the second normal pressure transfer mechanism 4B holds the processed wafer W and transfers it to the right cooling module 21B. After the four processed wafers W are carried out from the upper load lock module 3A, the left and right gate valves 32A and 32B of the upper load lock module 3A are closed to switch the atmosphere to a vacuum atmosphere. After that, as described above, the four unprocessed wafers W of the load lock module 3A are taken out by the vacuum transfer mechanism 51 and transferred to a predetermined processing module 6.

Further, while the wafers W are cooled down in the cooling modules 21A and 21B, the unprocessed wafers W are transferred to the load lock module 3B via the alignment module 20, and similarly, the processed wafers W accommodated in the load lock module 3B are transferred to the cooling modules 21A and 21B by the first normal pressure transfer mechanism 4A and the second normal pressure transfer mechanism 4B. In this way, since the cooling modules 21A and 21B make the wafer W carried out from the load lock modules 3A and 3B stand by, the cooling modules 21A and 21B are referred to as post-processing standby units, and the cooling modules 21A and 21B correspond to a first post-processing standby unit and a second post-processing standby unit, respectively.

Figure 12:
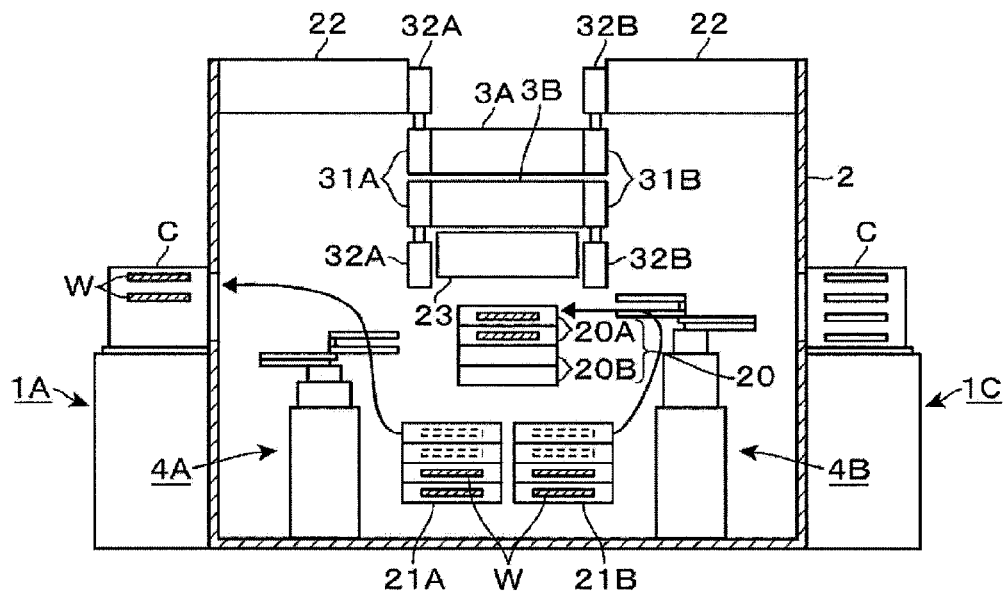
FIG. 12 is an explanatory diagram illustrating the operation of the first embodiment.
Figure 13:
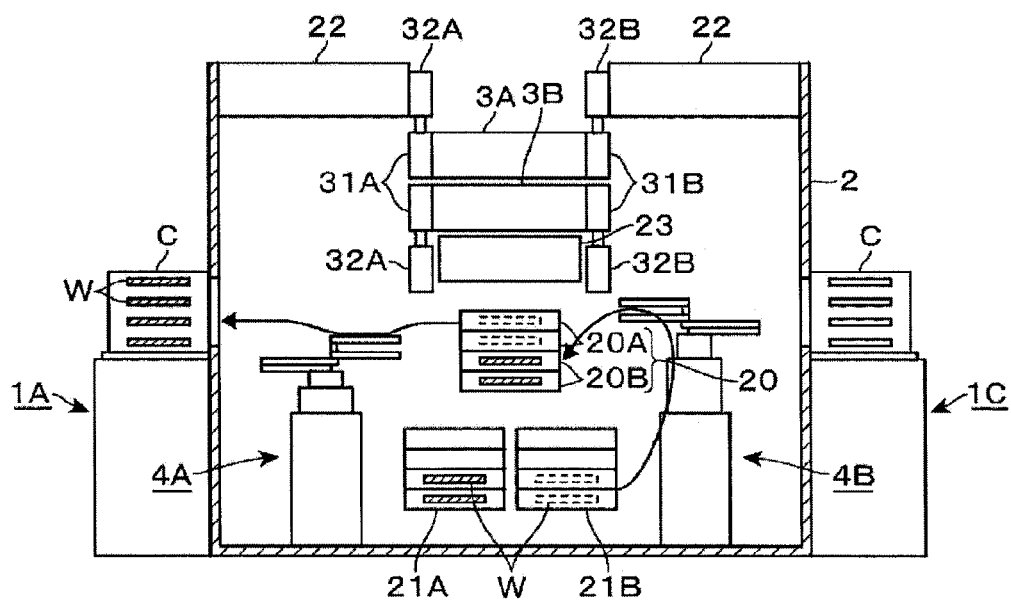
FIG. 13 is an explanatory diagram showing the operation of the first embodiment.

Thereafter, when the wafer W placed on the cooling module is sufficiently cooled down, as illustrated in FIG. 12, the first normal pressure transfer mechanism 4A receives the cooled wafer W from the left cooling module 21A and returns it to the carrier C of the loading/unloading ports 1A and 1B. Further, the second normal pressure transfer mechanism 4B receives the cooled wafer W from the right cooling module 21B and delivers it to the alignment module 20. After that, as illustrated in FIG. 13, the processed wafer W placed on the alignment module 20 is returned to the carrier C of the loading/unloading ports 1A and 1B by the first normal pressure transfer mechanism 4A. In this case, for example, the second normal pressure transfer mechanism 4B sequentially transfers the wafer W cooled by the cooling module 21B to the alignment module 20. The processed wafer W is placed on the alignment module 20, and thus the alignment module 20 corresponds to a post-processing substrate mounter. In this example, the alignment module 20 also serves as the pre-processing substrate mounter as well as the post-processing substrate mounter. Moreover, the pre-processing substrate mounter and the post-processing substrate mounter may be provided separately.

In this way, the first normal pressure transfer mechanism 4A and the second normal pressure transfer mechanism 4B transfer the unprocessed wafers W to the load lock modules 3A and 3B, and take out the processed wafers W transferred to the load lock modules 3A and 3B to transfer the processed wafers W to the carrier C.

Further, when taking out the wafer W accommodated in the carrier C placed in the right loading/unloading ports 1C and 1D when viewed from the front side, the wafer W is taken out of the carrier C by the second normal pressure transfer mechanism 4B and delivered to the alignment module 20. After that, the wafer W is transferred from the alignment module 20 to each of the load lock modules 3A and 3B by the first normal pressure transfer mechanism 4A and the second normal pressure transfer mechanism 4B. When returning the processed wafers W to the carrier C, the processed wafers are transferred from the load lock module 3A respectively to the left and right cooling modules 21A and 21B by the first normal pressure transfer mechanism 4A and the second normal pressure transfer mechanism 4B. After that, the wafer W cooled by the left cooling module 21A is transferred to the alignment module by the first normal pressure transfer mechanism 4A. Further, the second normal pressure transfer mechanism 4B returns the wafer W from the right cooling module 21B to the carrier C placed in the right loading/unloading ports 1C and 1D, and at the same time, returns the wafer W transferred to the alignment module 20 to the carrier C placed in the right loading/unloading ports 1C and 1D.

In this way, the wafers W are transferred between the carrier C, each of the load lock modules 3A and 3B, the alignment module 20, and the cooling modules 21A and 21B by the first normal pressure transfer mechanism 4A and the second normal pressure transfer mechanism 4B, and the wafers W are sequentially processed.

As described above, when the gate valve 34 on the vacuum transfer chamber 9 side in the load lock module 3A having a vacuum atmosphere is opened and the unprocessed wafer W is carried out, in a case where the processing of the wafer W ends in the processing module 6, the transfer is performed so that the unprocessed wafer W in the load lock module 3A is replaced with the processed wafer W. Specifically, this transfer operation will be described as below. The wafer W processed by one processing module 6 is received by the wafer support 55 of the vacuum transfer mechanism 51, and the wafer W is placed on the wafer holding section 38A of the load lock module 3A as described above. The wafer support 55 is temporarily retracted from the load lock module 3A, and the height of the wafer support 55 is changed in the vacuum transfer chamber 9 while maintaining a state where the load lock module 3A is released to the vacuum transfer chamber 9. Further, the wafer support 55 enters the load lock module 3A again, receives the unprocessed wafer W from the wafer holding section 38B, and transfers the wafer W to one processing module 6 or another processing module 6. During the transfer to the processing module 6, the load lock module 3A is isolated from the vacuum transfer chamber 9 and the atmosphere thereof is changed to an atmospheric atmosphere. Although the load lock module 3A is described as an example, the same transfer is performed for the load lock module 3B.

According to the above-mentioned vacuum processing apparatus, when the wafers W are disposed in a matrix of 2×2 in a plan view in the processing module 6 and collectively processed to increase throughput, the load lock modules 3A and 3B are also configured so that the wafers W are disposed in a matrix in a plan view similarly to the processing module 6. Then, the normal pressure transfer chamber 2 is provided so as to extend under the load lock modules 3A and 3B from one of the right and left sides of the load lock modules 3A and 3B to the other side of the right and left sides, and the transfer region of the wafer W in the normal pressure transfer chamber 2 and the load lock modules 3A and 3B vertically overlap. Further, the first normal pressure transfer mechanism 4A and the second normal pressure transfer mechanism 4B allow the carriers C of the loading/unloading ports 1A to 1D to deliver the wafer W to the right and left sides of the load lock modules 3A and 3B.

According to this configuration, as compared with the case where the normal pressure transfer chamber 2 is connected to the load lock modules 3A and 3B from a front direction, an amount of protrusion of the normal pressure transfer chamber 2 in the front-rear direction from the regions provided with the load lock modules 3A and 3B in a plan view can be suppressed to a small size. As a result, it is possible to suppress an increase in a front-rear width of the entire apparatus and suppress a footprint of the apparatus. Further, while reducing the size of the apparatus in this way, it is possible to secure a space required for transferring the wafer W and an installation space for each module such as the alignment module 20 in the normal pressure transfer chamber 2.

Further, as described above, the vacuum processing apparatus includes the first normal pressure transfer mechanism 4A and the second normal pressure transfer mechanism 4B. Accordingly, the transfer of the wafer W between the carrier C of the loading/unloading ports 1A and 1B and the load lock modules 3A and 3B, and the transfer of the wafer W between the carrier C of the loading/unloading ports 1A and 1B and the load lock modules 3A and 3B can be performed in parallel, and thus higher throughput can be obtained.

Meanwhile, in the vacuum processing apparatus, since various modules are provided in the transfer paths below the load lock modules 3A and 3B in the normal pressure transfer chamber 2, the amounts of right and left protrusions of the normal pressure transfer chamber 2 from the load lock modules 3A and 3B are more reliably suppressed. Further, the wafer W is delivered between the right side (left side) of the load lock modules 3A and 3B and the carrier C of the loading/unloading port 1 on the left side (right side) of the normal pressure transfer chamber 2 via this module. Therefore, when the wafer W is delivered between the loading/unloading ports 1A to 1D and the load lock modules 3A and 3B, the first normal pressure transfer mechanism 4A and the second normal pressure transfer mechanism 4B do not need to move across under the load lock modules 3A and 3B. Further, in the first normal pressure transfer mechanism 4A and the second normal pressure transfer mechanism 4B, it is not necessary to extend the arm to the shelf 38 on the rear side when viewed from the corresponding left transfer path 31A and right transfer path 31B, respectively.

Therefore, the support fork section 43, the upper stage arm section 42, and the lower stage arm section 41 of each of the first normal pressure transfer mechanism 4A and the second normal pressure transfer mechanism 4B can be shortened. Accordingly, a turning radius of each of the first normal pressure transfer mechanism 4A and the second normal pressure transfer mechanism 4B can be reduced, a footprint of the normal pressure transfer chamber 2 can be reduced, and thus an increase in a footprint of the entire apparatus can be suppressed more reliably Further, in the vacuum processing apparatus according to the present embodiment, the loading/unloading port 1 is provided at a position deviated from the load lock modules 3A and 3B to the left or right in front of the normal pressure transfer chamber 2. Accordingly, the front side wall of the housing 30 constituting the load lock modules 3A and 3B is exposed. As described with reference to FIG. 4, the pipes 302 and 304 through which air is supplied to and exhausted from the housing 30 are connected to the side wall, and the space between the transfer ports 1A and 1B and the transfer ports 1C and 1D is used to route the pipes 302 and 304. Therefore, it is possible to more reliably prevent an increase in the footprint of the apparatus, and for example, it is not necessary to route the pipes in the normal pressure transfer chamber 2, and thus a configuration of the apparatus can be simplified.

Further, it is not essential to provide the alignment module 20. Further, instead of the alignment module 20, a substrate mounter for the wafer W capable of delivering the wafer W from any one of the first normal pressure transfer mechanism 4A and the second normal pressure transfer mechanism 4B may be provided. That is, a module which places the wafer W thereon but not position it may be provided. When the positioning is not performed, for example, a mechanism for pressing the peripheral edge of the held wafer W from the peripheral edge side toward the central side may be provided with respect to the support fork section 43 of each of the first normal pressure transfer mechanism 4A and the second normal pressure transfer mechanism 4B. The center position of the wafer W may be positioned at a predetermined position of the holding section 43 of the wafer W by the pressing mechanism.

Moreover, the cooling modules 21A and 21B are not essential either. In that case, for example, the placed wafer W may be cooled by the load lock modules 3A and 3B.

Specifically, for example, instead of the shelf 38 for holding the wafer W, a stage through which a refrigerant flows may be provided in the load lock modules 3A and 3B so that the wafer W placed on the stage is cooled down.

In the vacuum processing apparatus, since the processing module 6 is provided so as to overlap the normal pressure transfer chamber 2 when viewed from the front-read direction, a left-right width of the apparatus is suppressed. Further, since the loading/unloading ports 1A to 1D are provided in front of the normal pressure transfer chamber 2, the width of the apparatus in the left-right direction is further suppressed, and thus the footprint of the entire apparatus is further suppressed. However, the loading/unloading ports 1A to 1D may be provided on the right and left sides of the normal pressure transfer chamber 2. Further, the present disclosure is not limited to the configuration in which two of the loading/unloading ports 1A to 1D and the remaining two are provided on the right and left sides of the normal pressure transfer chamber 2, respectively. For example, three or more loading/unloading ports 1A to 1D may be provided on the right and left sides, respectively.

Further, the first and second normal pressure transfer mechanisms 4A and 4B may be configured to be raised or lowered along a guide rail extending in the vertical direction. In that case, for example, a guide rail for supporting the first normal pressure transfer mechanism 4A may be provided at a left end on a rear side in the normal pressure transfer chamber 2, and a guide rail for supporting the second normal pressure transfer mechanism 4B may be provided at a right end on the rear side in the normal pressure transfer chamber 2. Then, the base 40 may be configured to be raised or lowered along the guide rail, and the lower stage arm section 41 may be rotatably provided on the base 40.

Further, for example, the cooling modules 21A and 21B may be configured such that a refrigerant such as cooling water passes through the substrate mounter on which the wafer W is placed to cool the wafer W. Further, for example, one cooling module may be used so that the wafer W can be delivered to and from any one of the first normal pressure transfer mechanism 4A and the second normal pressure transfer mechanism 4B. In this way, when the cooling module is configured so that the wafer W can be delivered to and from any one of the first normal pressure transfer mechanism 4A and the second normal pressure transfer mechanism 4B, the wafer W cooled by the cooling module can be returned to the carrier C without passing through the alignment module 20, and thus the transfer time of the wafer W can be shortened.

Further, the load lock modules 3A and 3B may have a configuration in which two wafers W are disposed side by side. Further, the normal pressure transfer chamber 2 may be provided so as to extend over the load lock modules 3A and 3B from one of the right and left sides of the load lock modules 3A and 3B to the other side of the right and left sides.

Further, when viewed from the front side, the wafer W taken out of the carrier C of the loading/unloading ports 1A and 1B may be delivered to the left shelf 38, and the wafer W taken out of the carrier C of the loading/unloading port 1C and 1D may be delivered to the right shelf 38.

For example, the wafer W is taken out of the carrier C of the loading/unloading ports 1A and 1B by the first normal pressure transfer mechanism 4A and transferred to the alignment module 20. Further, the wafer W transferred to the alignment module 20 is received by the first normal pressure transfer mechanism 4A and delivered to the left shelf 38 when viewed from the front side of the load lock module 3A.

Then, the wafer W is taken out of the carrier C of the loading/unloading ports 1C and 1D by the second normal pressure transfer mechanism 4B and transferred to the alignment module 20. Further, the wafer W transferred to the alignment module 20 is received by the second normal pressure transfer mechanism 4B and delivered to the right shelf 38 when viewed from the front side of the load lock module 3A. The examples are also included within the scope of this disclosure.

Similarly, the wafer W received from the left shelf 38 of the load lock modules 3A and 3B may be transferred to the left cooling module 21A and then returned to the carrier C of the left loading/unloading ports 1A and 1B. Then, the wafer W received from the right shelf 38 of the load lock modules 3A and 3B may be transferred to the right cooling module 21B and then returned to the carrier C of the right loading/unloading ports 1C and 1D. That is, in the normal pressure transfer chamber 2, the present disclosure is not limited to the transfer in which the wafer W moves from the right (left) transfer path of the load lock modules 3A and 3B to the left (right) transfer path across the transfer area below the load lock modules 3A and 3B.

Further, when the gate valves 32A and 32B are provided on the left and right sides of one housing 30, it is possible that the left and right gate valves 32A and 32B are opened at different times. In that case, for example, in a state where one of the gate valves 32A and 32B is opened, the other of the gate valves 32A and 32B is opened or closed, and thus an air flow may be generated in the housing 30 to generate particles. Therefore, in the load lock modules 3A and 3B, the space inside the housing 30 may be partitioned into a space where the left wafer holding sections 38A and 38B are disposed and a space where the right wafer holding sections 38A and 38B are disposed. Accordingly, the atmospheres of the left space and the right space are isolated from each other, and in one space, the influence of opening and closing of the gate valves 32A and 32B in the other space can be suppressed, and thus the above-mentioned turbulence of the air flow can be suppressed. Then, it may be configured so that switching between the normal pressure atmosphere and the vacuum atmosphere can occur separately for each partitioned space. The case where the partitioned spaces are disposed so as to be separated from each other on the left and right is also included in the case where the inside of the housing 30 is partitioned into the left and right spaces.

Further, the vacuum transfer mechanism 51 of the present disclosure configures the wafer support 55 so as to include the two elongated spatula-shaped support main bodies 56 which extend horizontally in parallel with each other and the connection section 57 which extends in the horizontal direction to be orthogonal to the extension direction of the support main body 56 and connects the proximal ends of the two support main bodies 56 to each other. Therefore, even when the inside of the housing 30 is configured to be partitioned into left and right spaces, the two support main bodies 56 can enter the right space and the left space partitioned in the housing 30 at the same time. Therefore, the wafers W can be collectively delivered between the left wafer holding sections 38A and 38B and the right wafer holding sections 38A and 38B.

Further, the normal pressure transfer chamber 2 may be filled with nitrogen gas as an internal atmosphere. Further, the processing module 6 connected to the vacuum transfer chamber 9 is not limited to the film forming apparatus, and may be an etching apparatus, an annealing apparatus, or a combination thereof.

Second Embodiment

Figure 14:
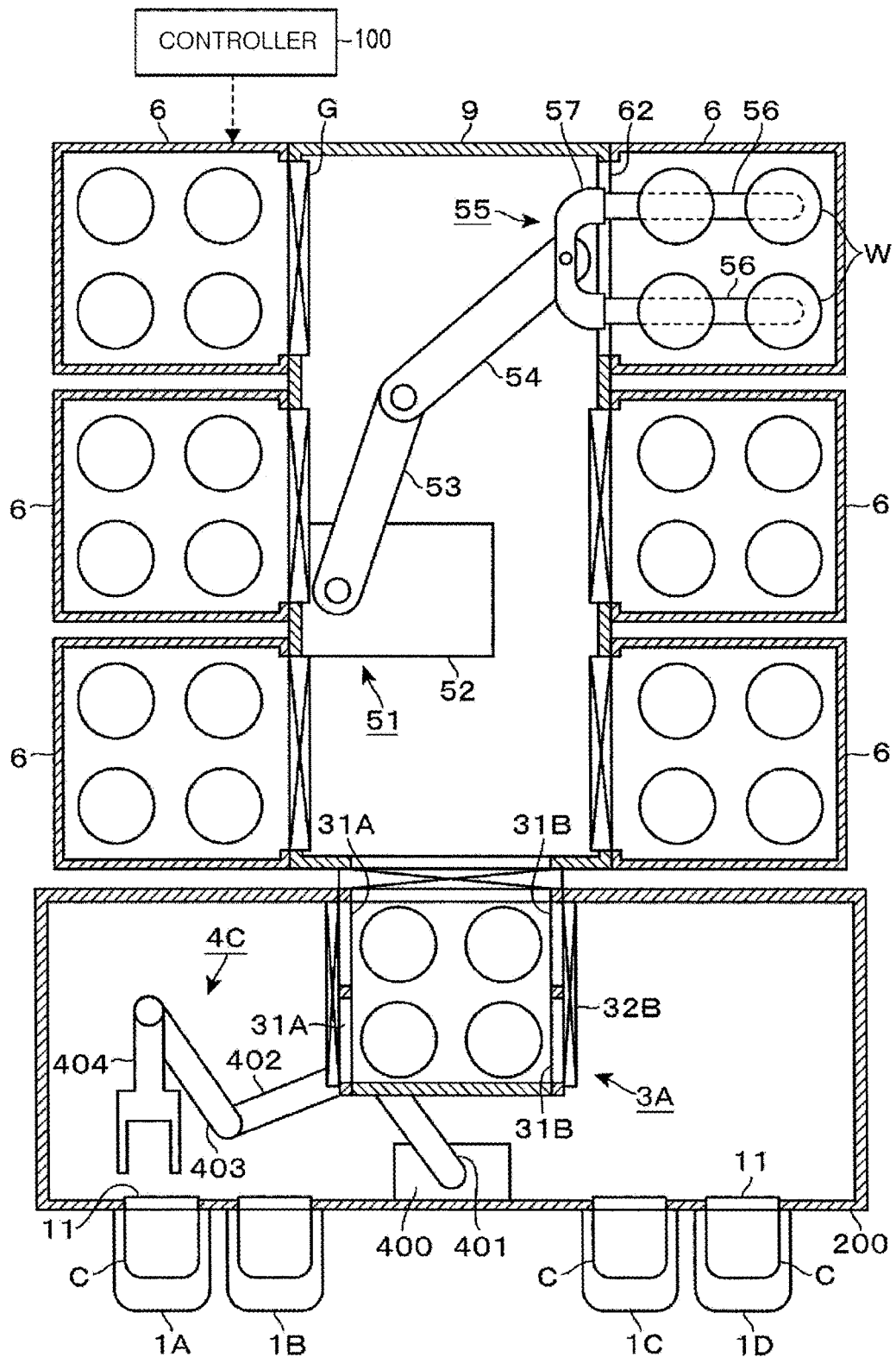
FIG. 14 is a plan view of a vacuum processing apparatus according to a second embodiment.
Figure 15:
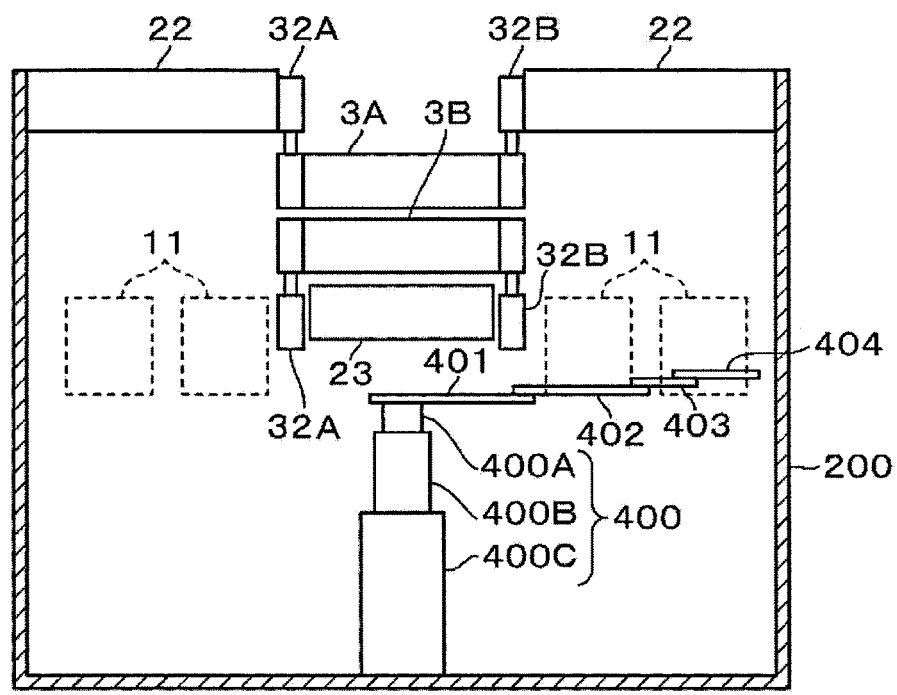
FIG. 15 is a longitudinal cross-sectional view of a normal pressure transfer chamber.

Further, the normal pressure transfer chamber 2 may include one normal pressure transfer mechanism. In an example illustrated in FIGS. 14 and 15, the load lock modules 3A and 3B are provided near the rear side of the normal pressure transfer chamber 2. In this example, a normal pressure transfer mechanism 4C is provided in front of the load lock modules 3A and 3B in the normal pressure transfer chamber. More specifically, the front wall of a housing 200 constituting the normal pressure transfer chamber 2 is located in front of the front walls of the load lock modules 3A and 3B. A space between the front wall of the housing 200 and the front wall of the load lock modules 3A and 3B is configured as a moving path through which the normal pressure transfer mechanism 4C moves.

Similar to the first and second normal pressure transfer mechanisms 4A and 4B, the normal pressure transfer mechanism 4C includes a lower stage member 400A, a middle stage member 400B, and an upper stage member 400C, and includes a base 400 configured to be expandable and contractible. The upper stage member 400C of the base 400 includes an articulated arm in which a lower stage arm section 401, a middle stage arm section 402, an upper stage arm section 403, and a support fork 404 for holding the wafer W are coupled in this order, and the articulated arm is rotatably provided.

Further, in this example, the alignment module 20 and the cooling modules 21A and 21B are not provided below the load lock modules 3A and 3B. However, similar to the vacuum processing apparatus illustrated in FIGS. 1 to 3, the alignment module 20 and the cooling modules 21A and 21B may be provided.

In this vacuum processing apparatus, in a case where the wafer W taken out of the carrier C arranged on the left side is transferred to the load lock modules 3A and 3B, when the wafer W is delivered to the shelf 38 on the left side of the load lock modules 3A and 3B, the normal pressure transfer mechanism 4C enters the load lock modules 3A and 3B from the left transfer path 31A to deliver the wafer W. Moreover, when the wafer W is delivered from the carrier C disposed on the left side to the right shelf 38 of the load lock modules 3A and 3B when viewed from the front side, the normal pressure transfer mechanism 4C which has received the wafer W from the carrier C passes through the lower side of the load lock modules 3A and 3B and moves to the right side of the load lock modules 3A and 3B. Further, the normal pressure transfer mechanism 4C enters the load lock modules 3A and 3B from the right transfer path 31B and delivers the wafer W to the right shelf 38.

Even in such a vacuum processing apparatus, the load lock modules 3A and 3B in which the wafers W are disposed in two rows from the left to the right and two rows from the front to the rear are disposed so as to overlap the transfer area of the wafer W in the normal pressure transfer chamber 2 vertically, and thus the footprint of the apparatus can be suppressed. Further, since only the normal pressure transfer mechanism 4C is provided as the transfer mechanism of the normal pressure transfer chamber 2, manufacturing costs of the apparatus can be suppressed.

As described above, the presently disclosed embodiments are considered in all respects to be illustrative and not restrictive. The above-described embodiments can be embodied in various forms. Further, the above-described embodiments may be omitted, replaced, or changed in various forms without departing from the scope of the appended claims and the gist thereof.

DESCRIPTION OF REFERENCE NUMERALS

1: loading/unloading port
2: normal pressure transfer chamber
3A, 3B: load lock module
6: processing module
4A: first normal pressure transfer mechanism
4B: second normal pressure transfer mechanism
38A, 38B: wafer holding section
9: vacuum transfer chamber
51: vacuum transfer mechanism
20: alignment module
21A, 21B: cooling module
W: wafer

The invention claimed is:

1. A vacuum processing apparatus comprising:
a load lock module including one housing and a plurality of substrate holding sections, wherein the inside of the housing is switchable between a normal pressure atmosphere and a vacuum atmosphere, the housing has openable/closeable first substrate transfer ports formed on both of right and left sides thereof and an openable/closeable second substrate transfer port formed on a rear side thereof, and each of the plurality of substrate holding sections is configured to hold a substrate on a right or left side in the housing;
a vacuum transfer chamber having a vacuum atmosphere, wherein the vacuum transfer chamber is connected to the rear side of the housing and the second substrate transfer port is opened to the vacuum transfer chamber;
a processing module, connected to the vacuum transfer chamber, for vacuum-processing the substrate;
a vacuum transfer mechanism configured to transfer the substrate between the load lock module, the vacuum transfer chamber, and the processing module;
a normal pressure transfer chamber having a normal pressure atmosphere, wherein the normal pressure transfer chamber extends over or under the housing from one of the right and left sides of the housing to the other one thereof so that each of the first substrate transfer ports is opened, the normal pressure transfer chamber includes a stacked transfer region, and the stacked transfer region is a region overlapping the housing to which the substrate is transferred;
a plurality of loading/unloading ports, provided on right and left outer sides of the normal pressure transfer chamber, for loading or unloading a transfer container accommodating the substrate; and
a normal pressure transfer mechanism configured to transfer the substrate between each of the substrate holding sections and the transfer container carried into each of the loading/unloading ports via the stacked transfer region.

2. The vacuum processing apparatus according to claim 1, wherein the normal pressure transfer mechanism delivers the substrate, via the stacked transfer region, between the loading/unloading port on one of the right and left outer sides and the substrate holding section on the other one of the right and left sides.

3. The vacuum processing apparatus according to claim 1, wherein a substrate mounter configured to place the substrate thereon is provided in the stacked transfer region.

4. The vacuum processing apparatus according to claim 3, wherein the substrate mounter includes a pre-processing substrate mounter on which an unprocessed substrate to be transferred to the load lock module is placed.

5. The vacuum processing apparatus according to claim 4, wherein the pre-processing substrate mounter includes an alignment mechanism having a rotating unit and a detector, the rotating unit is configured to rotate the substrate received from the normal pressure transfer mechanism, and the detector is configured to illuminate with light a region including a peripheral edge of the substrate that rotates and to receive light passing through the region to execute positional matching between the substrate and the normal pressure transfer mechanism.

6. The vacuum processing apparatus according to claim 3, wherein the substrate mounter includes a post-processing standby unit on which the substrate carried out from the load lock module is placed for standby.

7. The vacuum processing apparatus according to claim 1, wherein a plurality of load lock modules are provided to overlap each other in a vertical direction.

8. The vacuum processing apparatus according to claim 1, wherein four substrate holding sections are provided in a 2 by 2 matrix so as to hold each of substrates, such that an arrangement direction of the substrates is defined along front-rear and left-right directions of the matrix when viewed in a plane.

9. The vacuum processing apparatus according to claim 1, wherein in the load lock module, the inside of the housing is partitioned into a space in which substrate holding sections on the left side are disposed and a space in which substrate holding sections on the right side are disposed.

10. The vacuum processing apparatus according to claim 1, wherein the loading/unloading ports are provided on the left and right sides with respect to the housing, and each of the loading/unloading ports is provided in front of the normal pressure transfer chamber.

11. The vacuum processing apparatus according to claim 1, wherein the normal pressure transfer chamber extends under the housing from one of the right and left sides of the housing to the other one thereof, and the stacked transfer region is formed under the housing.

12. The vacuum processing apparatus according to claim 1, wherein the normal pressure transfer mechanism includes:
a first normal pressure transfer mechanism provided on one of the right and left sides with respect to the housing and configured to deliver the substrate to a substrate mounter and only to one of right and left substrate holding sections among the plurality of substrate holding sections, and
a second normal pressure transfer mechanism provided on the other one of the right and left sides with respect to the housing and configured to deliver the substrate to the substrate mounter and only to the other one of the right and left substrate holding sections among the plurality of substrate holding sections.

13. The vacuum processing apparatus according to claim 12, wherein the substrate mounter includes a pre-processing substrate mounter on which an unprocessed substrate to be transferred to the load lock module is placed,
the substrate is delivered by the first normal pressure transfer mechanism and the second normal pressure transfer mechanism with respect to the pre-processing substrate mounter, and
substrates sequentially transferred to the pre-processing substrate mounter by one of the first normal pressure transfer mechanism and the second normal pressure transfer mechanism are transferred to the load lock module by said one of the first normal pressure transfer mechanism and the second normal pressure transfer mechanism.

14. The vacuum processing apparatus according to claim 12, wherein the substrate mounter includes:
a post-processing standby unit on which the substrate carried out from the load lock module is placed for standby, and
a post-processing substrate mounter configured to place thereon a processed substrate delivered from the first normal pressure transfer mechanism and the second normal pressure transfer mechanism,
the post-processing standby unit includes:
a first post-processing standby unit to which the substrate is delivered only from the first normal pressure transfer mechanism of the first normal pressure transfer mechanism and the second normal pressure transfer mechanism, and
a second post-processing standby unit to which the substrate is delivered only from the second normal pressure transfer mechanism of the first normal pressure transfer mechanism and the second normal pressure transfer mechanism, and
the substrate is transferred from one of the first post-processing standby unit and the second post-processing standby unit to the post-processing substrate mounter, and the substrate is transferred to the transfer container by a normal pressure transfer mechanism other than the normal pressure transfer mechanism of the first normal pressure transfer mechanism and the second normal pressure transfer mechanism that was used for transferring the substrate to the post-processing substrate mounter.

15. The vacuum processing apparatus according to claim 1, wherein the plurality of loading/unloading ports are provided on right and left sides of the housing with respect to a lateral center of the housing, and the normal pressure transfer mechanism is shared by each of the loading/unloading ports.

16. The vacuum processing apparatus according to claim 15, wherein a moving path of the normal pressure transfer mechanism is formed in front of the housing in the normal pressure transfer chamber.

17. The vacuum processing apparatus according to claim 1, wherein the substrate holding sections are provided in a plurality of stages on upper and lower regions of the housing.

18. The vacuum processing apparatus according to claim 17, wherein a substrate transferred from the normal pressure transfer chamber to the load lock module is held by a substrate holding section on one of the upper and lower sides, and a substrate transferred from the vacuum transfer chamber to the load lock module is held by a substrate holding section on the other one of the upper and lower sides.

19. A substrate transfer method for transferring a substrate in a vacuum processing apparatus comprising a load lock module including one housing and a plurality of substrate holding sections, wherein the inside of the housing is switchable between a normal pressure atmosphere and a vacuum atmosphere, the housing has openable/closeable first substrate transfer ports formed on both of right and left sides thereof, and an openable/closeable second substrate transfer port formed on a rear side thereof, and each of the plurality of substrate holding sections is configured to hold a substrate on a right or left side in the housing, the method comprising:
loading or unloading a transfer container accommodating the substrate with respect to a plurality of loading/unloading ports provided on right and left outer sides of a normal pressure transfer chamber having a normal pressure atmosphere, wherein the normal pressure transfer chamber extends over or under the housing from one of the right and left sides of the housing to the other one thereof so that each of the first substrate transfer ports is opened;

transferring, by a normal pressure transfer mechanism, the substrate between each of the substrate holding sections and the transfer container carried into each of the loading/unloading ports via a stacked transfer region, wherein the stacked transfer region is a region overlapping the housing in the normal pressure transfer chamber to which the substrate is transferred; and transferring, by a vacuum transferring mechanism, the substrate between a vacuum transfer chamber having a vacuum atmosphere, a processing module connected to the vacuum transfer chamber for vacuum-processing the substrate, and the load lock module, wherein the vacuum transfer chamber is connected to the rear side of the housing and the second substrate transfer port is opened to the vacuum transfer chamber.

* * * * *